(12) United States Patent
Camacho et al.

(10) Patent No.: US 8,546,189 B2
(45) Date of Patent: *Oct. 1, 2013

(54) SEMICONDUCTOR DEVICE AND METHOD OF FORMING A WAFER LEVEL PACKAGE WITH TOP AND BOTTOM SOLDER BUMP INTERCONNECTION

(75) Inventors: Zigmund R. Camacho, Singapore (SG); Lionel Chien Hui Tay, Singapore (SG); Henry D. Bathan, Singapore (SG); Jeffrey D. Punzalan, Singapore (SG); Dioscoro A. Merilo, Singapore (SG)

(73) Assignee: Stats ChipPAC, Ltd., Singapore (SG)

( * ) Notice: Subject to any disclaimer, the term of this patent is extended or adjusted under 35 U.S.C. 154(b) by 719 days.

This patent is subject to a terminal disclaimer.

(21) Appl. No.: 12/410,213

(22) Filed: Mar. 24, 2009

(65) Prior Publication Data

US 2010/0072599 A1    Mar. 25, 2010

Related U.S. Application Data

(63) Continuation-in-part of application No. 12/235,000, filed on Sep. 22, 2008, now Pat. No. 7,888,181.

(51) Int. Cl.
*H01L 23/52* (2006.01)
*H01L 21/00* (2006.01)

(52) U.S. Cl.
USPC ............... 438/118; 257/738; 257/E23.141; 257/E21.001

(58) Field of Classification Search
USPC ............ 257/692, 696, 737, 738; 438/107, 438/109, 121–126
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,960,826 B2 | 11/2005 | Ho et al. | |
| 7,009,297 B1 * | 3/2006 | Chiang et al. | 257/738 |
| 7,190,080 B1 * | 3/2007 | Leu et al. | 257/778 |
| 7,619,901 B2 | 11/2009 | Eichelberger et al. | |
| 7,888,181 B2 * | 2/2011 | Camacho et al. | 438/118 |
| 2004/0080025 A1 * | 4/2004 | Kasahara et al. | 257/666 |
| 2004/0178495 A1 * | 9/2004 | Yean et al. | 257/723 |
| 2005/0124147 A1 | 6/2005 | Shiu et al. | |
| 2005/0268847 A1 | 12/2005 | Farnworth | |
| 2007/0172983 A1 | 7/2007 | Huang et al. | |
| 2007/0172984 A1 | 7/2007 | Huang et al. | |

(Continued)

*Primary Examiner* — Ha Tran T Nguyen
*Assistant Examiner* — Raj R Gupta
(74) *Attorney, Agent, or Firm* — Robert D. Atkins; Patent Law Group: Atkins & Associates, P.C.

(57) ABSTRACT

A semiconductor device is made by forming solder bumps over a copper carrier. Solder capture indentations are formed in the copper carrier to receive the solder bumps. A semiconductor die is mounted to the copper carrier using a die attach adhesive. The semiconductor die has contact pads formed over its active surface. An encapsulant is deposited over the copper carrier, solder bumps, and semiconductor die. A portion of the encapsulant is removed to expose the solder bumps and contact pads. A conductive layer is formed over the encapsulant to connect the solder bumps and contact pads. The conductive layer operates as a redistribution layer to route electrical signals from the solder bumps to the contact pads. The copper carrier is removed. An insulating layer is formed over the conductive layer and encapsulant. A plurality of semiconductor devices can be stacked and electrically connected through the solder bumps.

22 Claims, 14 Drawing Sheets

(56) References Cited

U.S. PATENT DOCUMENTS

| | | |
|---|---|---|
| 2007/0172985 A1 | 7/2007 | Huang et al. |
| 2007/0172986 A1 | 7/2007 | Huang et al. |
| 2007/0187711 A1 | 8/2007 | Hsiao et al. |
| 2008/0197469 A1 | 8/2008 | Yang et al. |

* cited by examiner

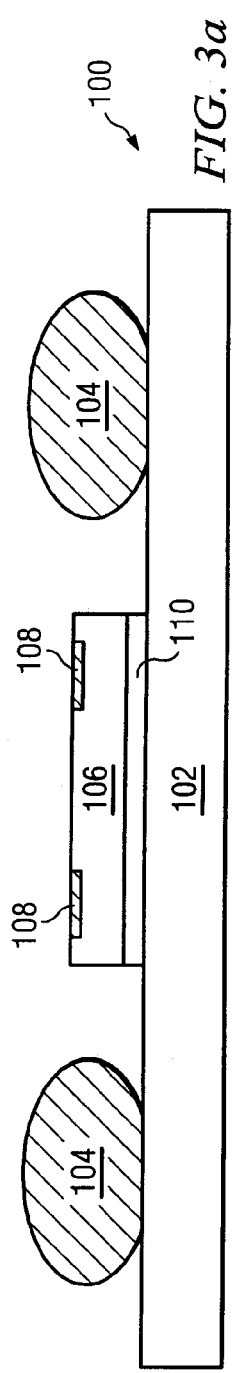
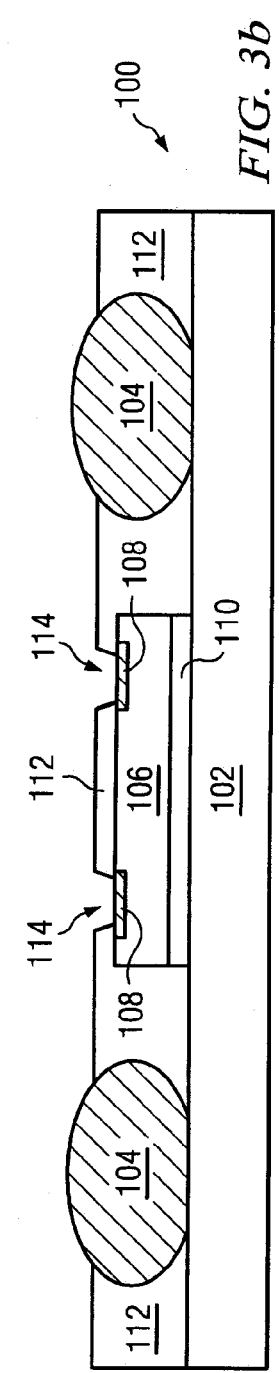
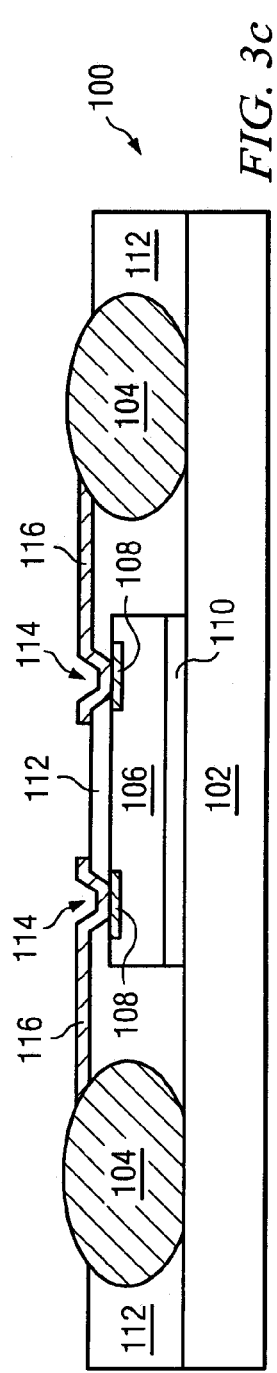
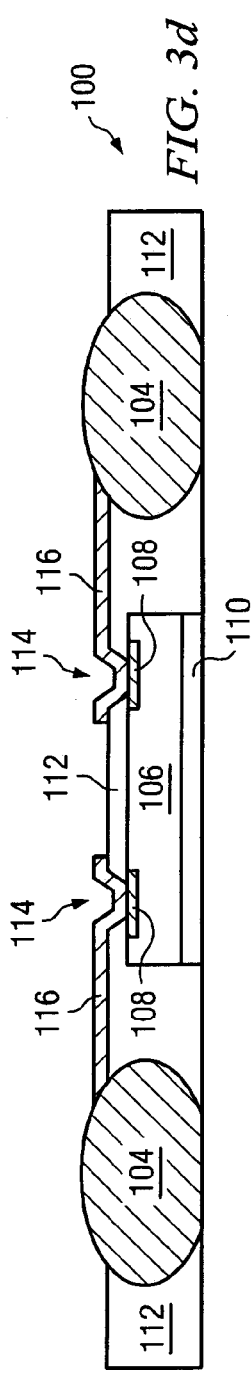
FIG. 3a
FIG. 3b
FIG. 3c
FIG. 3d

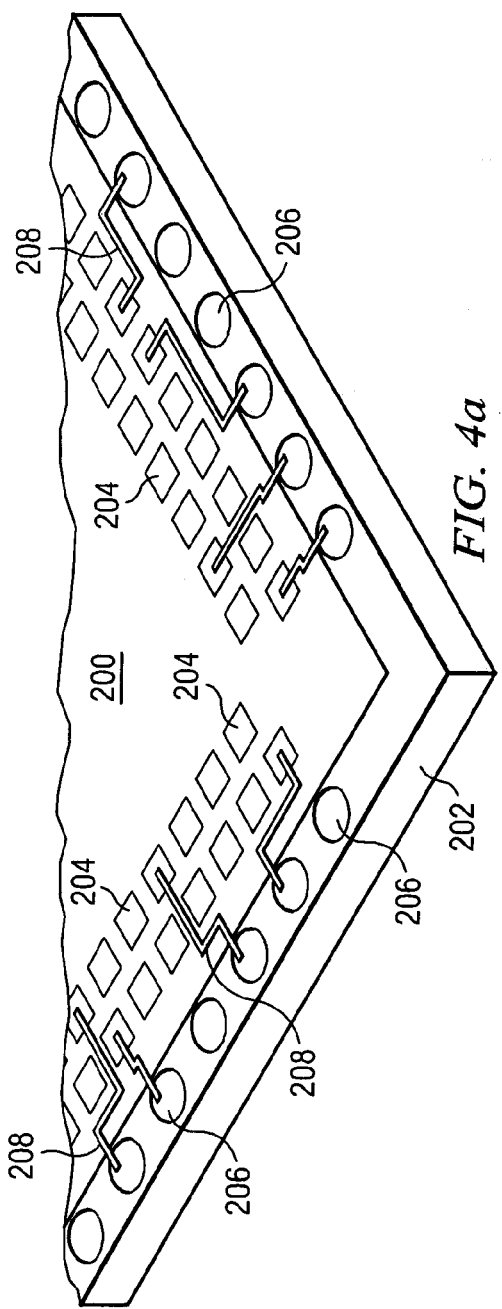
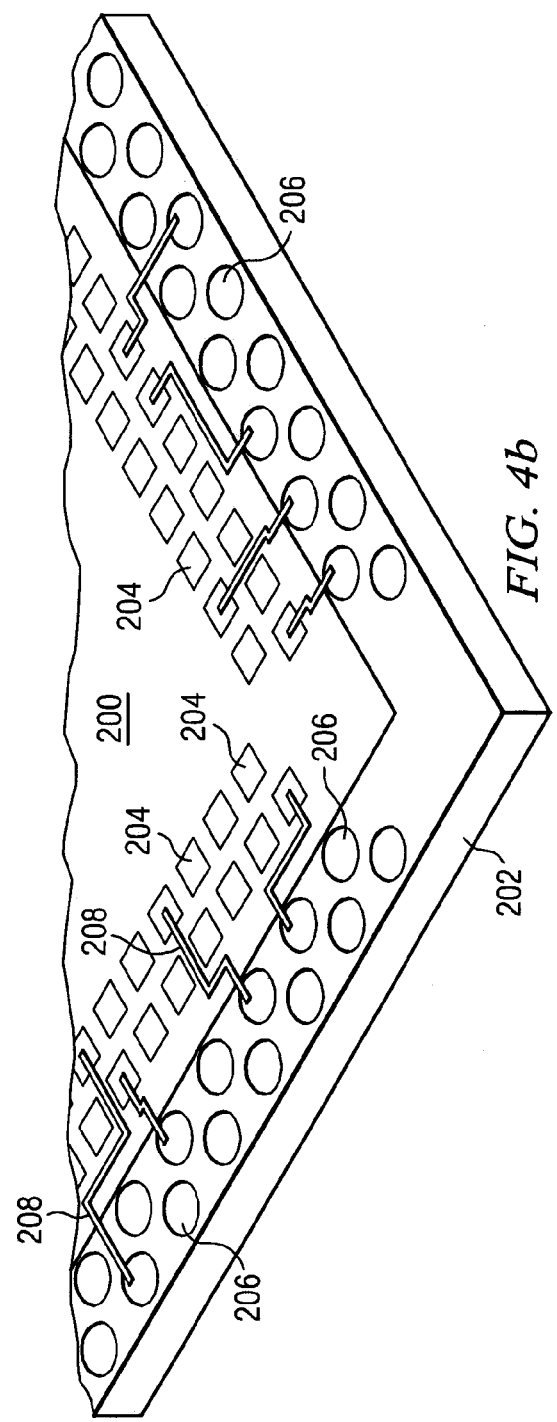

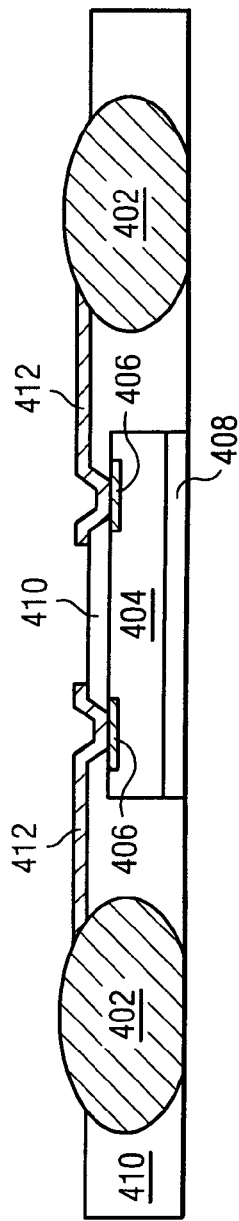
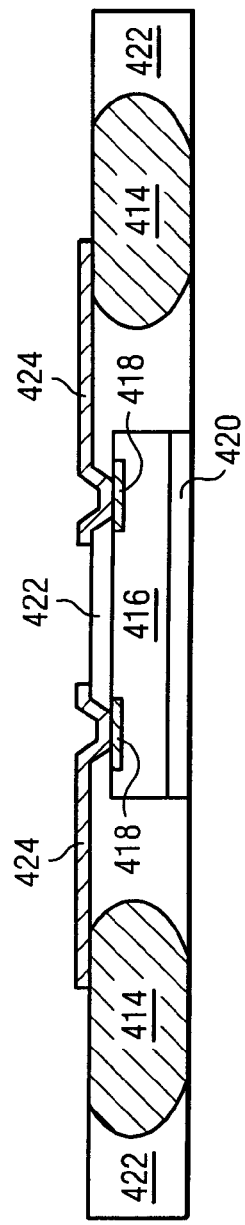
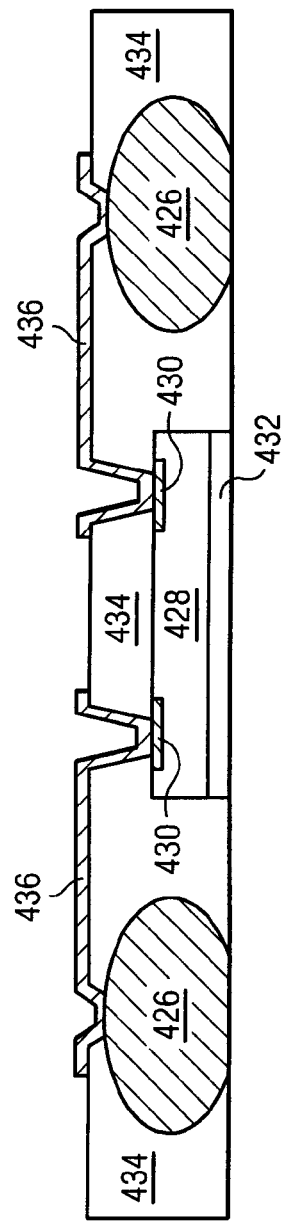
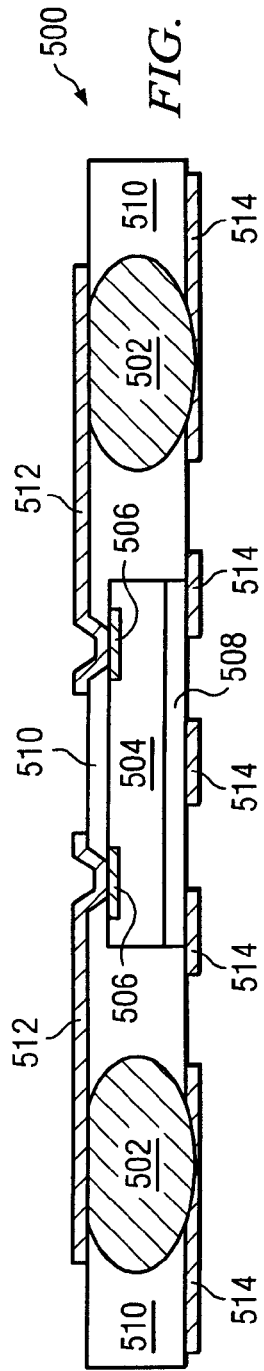

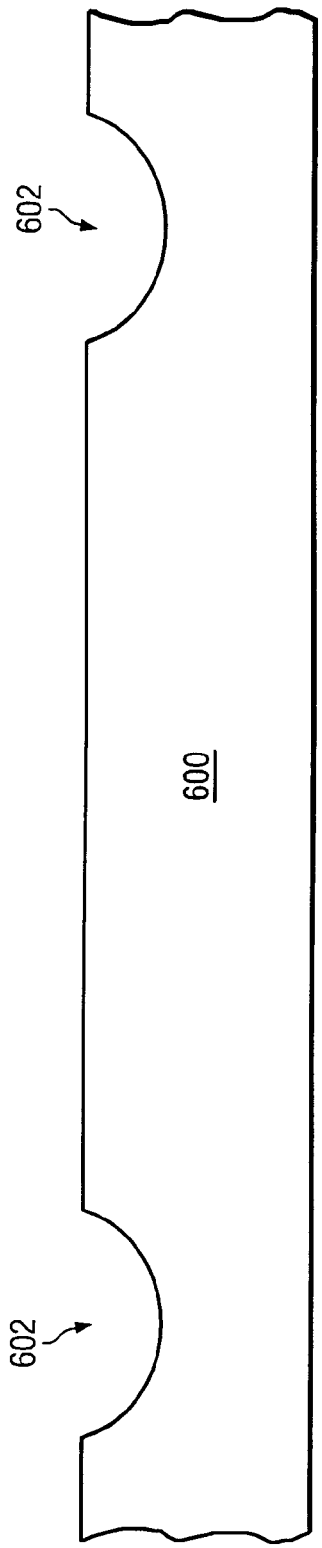
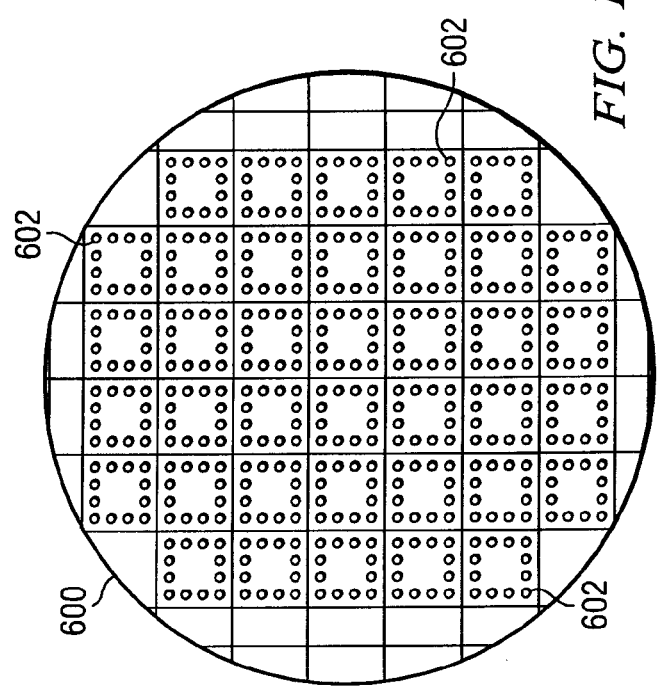

SEMICONDUCTOR DEVICE AND METHOD OF FORMING A WAFER LEVEL PACKAGE WITH TOP AND BOTTOM SOLDER BUMP INTERCONNECTION

CLAIM TO DOMESTIC PRIORITY

The present application is a continuation-in-part of U.S. application Ser. No. 12/235,000, now U.S. Pat. No. 7,888, 181, filed Sep. 22, 2008, entitled "Semiconductor Device and Method of Forming a Wafer Level Package with Bump Interconnection" by Zigmund R. Camacho et al.

FIELD OF THE INVENTION

The present invention relates in general to semiconductor devices and, more particularly, to a semiconductor device including a wafer-level chip-scale package (CSP) having a top and bottom solder bump interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Often, when forming wafer-level chip-scale packages (WLCSPs), it is necessary to form top and bottom interconnection structures in the packages. The top and bottom interconnect structure facilitates the mounting of the WLCSPs to motherboards, and other printed circuit boards (PCBs) or substrates. Furthermore, by forming the interconnections on top and bottom surfaces of the package, multiple WLCSPs can be placed over one-another to form stacked packages that provide sophisticated functionality in a small package volume. The top and bottom interconnects usually include conductive through-hole vias (THVs) formed within a perimeter of the WLCSP. Conductive THVs are difficult to manufacture and require several additional fabrication steps that increase the cost and manufacturing time of the WLCSP. Furthermore, as fabrication technologies improve, average die size shrinks and the number of input/output pins per die increases. Due to the increasing pin density, it is difficult to mount the resulting die to conventional motherboards which are configured for ball grid array (BGA) mounting technologies using larger input/output bumps with a larger pitch.

SUMMARY OF THE INVENTION

A need exists to vertically interconnect semiconductor devices. Accordingly, in one embodiment, the present invention is a method of making a semiconductor device comprising the steps of providing a copper carrier, forming first solder bumps over the copper carrier, and mounting a first semiconductor die to the copper carrier using a die attach adhesive. The first semiconductor die has a plurality of contact pads formed over its active surface. The method further includes the steps of depositing an encapsulant over the copper carrier, first solder bumps, and first semiconductor die, removing a portion of the encapsulant to expose the first solder bumps and contact pads of the first semiconductor die, forming a conductive layer over the encapsulant to connect the first solder bumps and contact pads of the first semiconductor die, and removing the copper carrier.

In another embodiment, the present invention is a method of making a semiconductor device comprising the steps of providing a substrate, forming first solder bumps over the substrate, and mounting a first semiconductor die to the substrate. The first semiconductor die has a plurality of contact pads formed over its active surface. The method further includes the steps of depositing an encapsulant over the substrate, first solder bumps, and first semiconductor die, removing a first portion of the encapsulant to expose the first solder bumps and contact pads of the first semiconductor die, and forming a conductive layer over the encapsulant to connect the first solder bumps and contact pads of the first semiconductor die.

In another embodiment, the present invention is a method of making a semiconductor device comprising the steps of providing a substrate, forming an interconnect structure over the substrate, and mounting a semiconductor die to the substrate. The semiconductor die has a plurality of contact pads formed over its active surface. The method further includes the steps of depositing an encapsulant over the substrate, removing a first portion of the encapsulant to expose the interconnect structure and contact pads of the semiconductor die, and forming a conductive layer over the encapsulant to connect the interconnect structure and contact pads of the semiconductor die.

In another embodiment, the present invention is a semiconductor device comprising a semiconductor die having a plurality of contact pads formed over a surface of the semiconductor die. An interconnect structure is disposed around a perimeter of the semiconductor die. An encapsulant is formed over the interconnect structure and semiconductor die. A plurality of vias is formed into the encapsulant to expose the interconnect structure and contact pads of the semiconductor die. A conductive layer is conformally formed over the encapsulant to electrically connect the interconnect structure and contact pads of the semiconductor die.

BRIEF DESCRIPTION OF THE DRAWINGS

FIGS. 3a-3d illustrate a method of manufacturing a semiconductor device having an interconnect structure providing top and bottom interconnects formed by solder bumps;

FIGS. 4a and 4b illustrate alternative configurations for the plurality of solder bumps that form the interconnect structure of the present semiconductor device;

FIG. 6 illustrates a semiconductor device having an interconnect structure providing top and bottom interconnects formed by solder bumps, a top surface of the solder bumps protrudes past a top-surface of the encapsulant;

FIG. 7 illustrates a semiconductor device having an interconnect structure providing top and bottom interconnects formed by solder bumps, a top surface of the semiconductor device is planarized to expose the solder bumps;

FIG. 8 illustrates a semiconductor device having an interconnect structure providing top and bottom interconnects formed by solder bumps, vias are formed in the encapsulant to expose contact pads of the die and a top surface of the solder bumps;

FIG. 9 illustrates a semiconductor device having an interconnect structure providing top and bottom interconnects formed by solder bumps, redistribution layers (RDLs) are formed over a top surface and a bottom surface of the semiconductor device;

FIGS. 10a-10h illustrate an alternate process of manufacturing a semiconductor device having top and bottom solder bump interconnect structure;

DETAILED DESCRIPTION OF THE DRAWINGS

Figure 1:
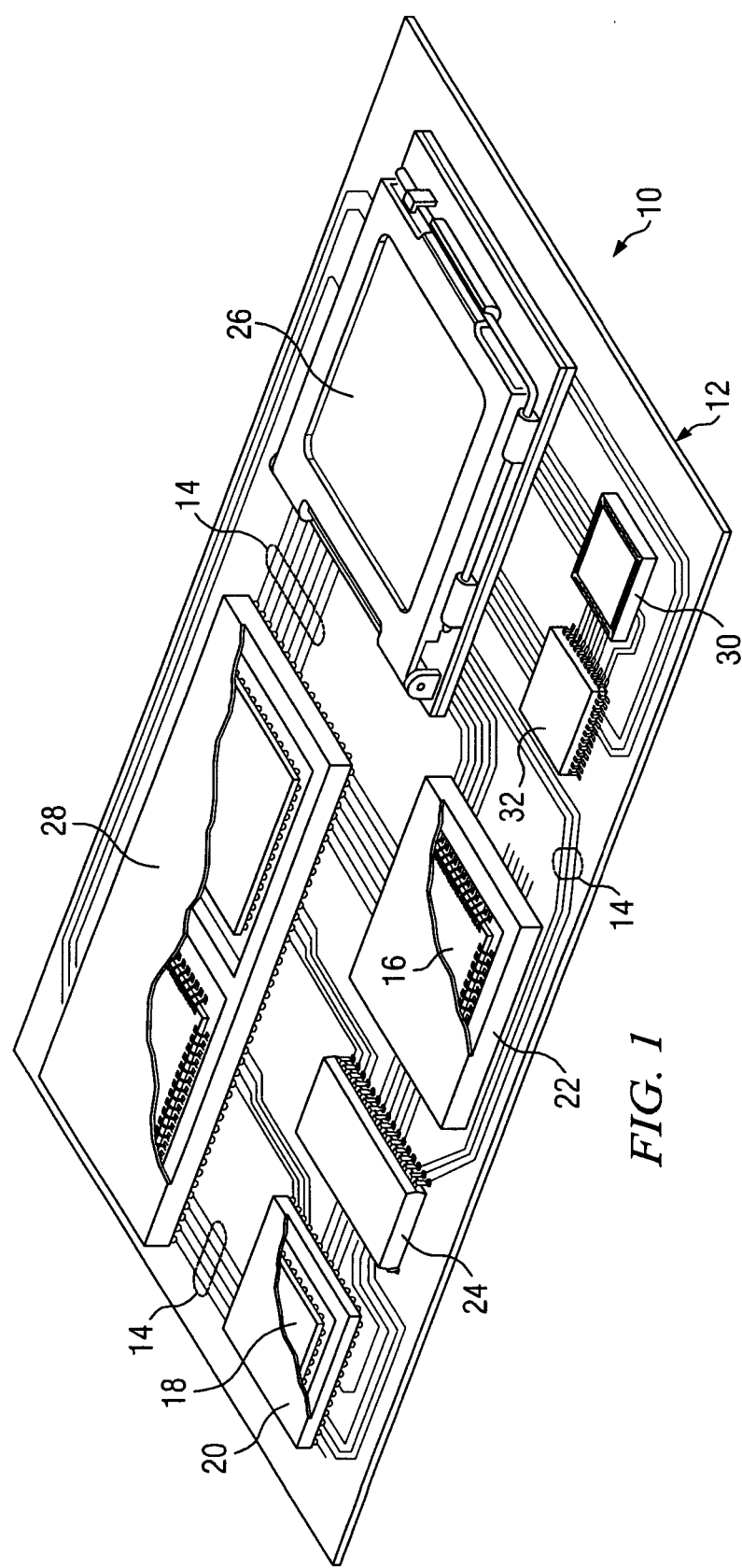
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
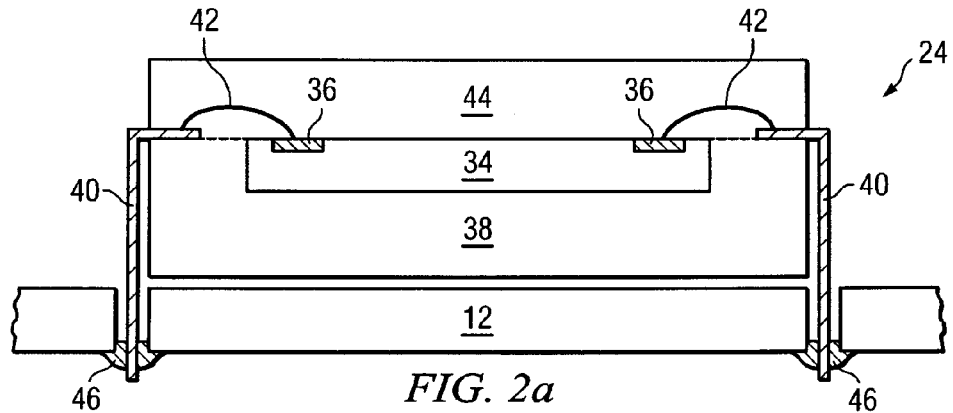
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
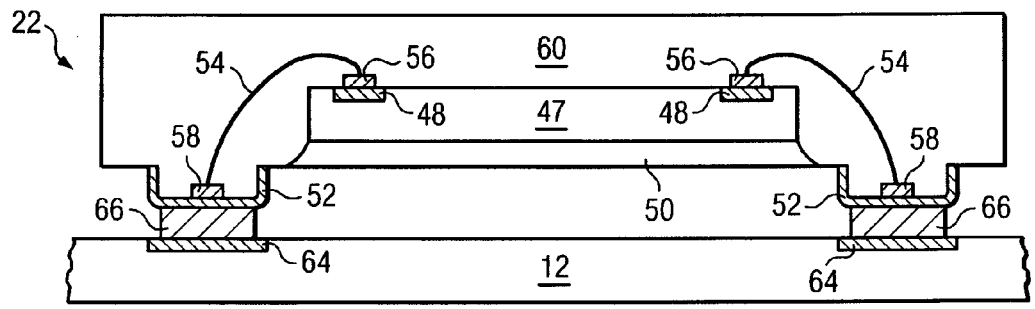

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
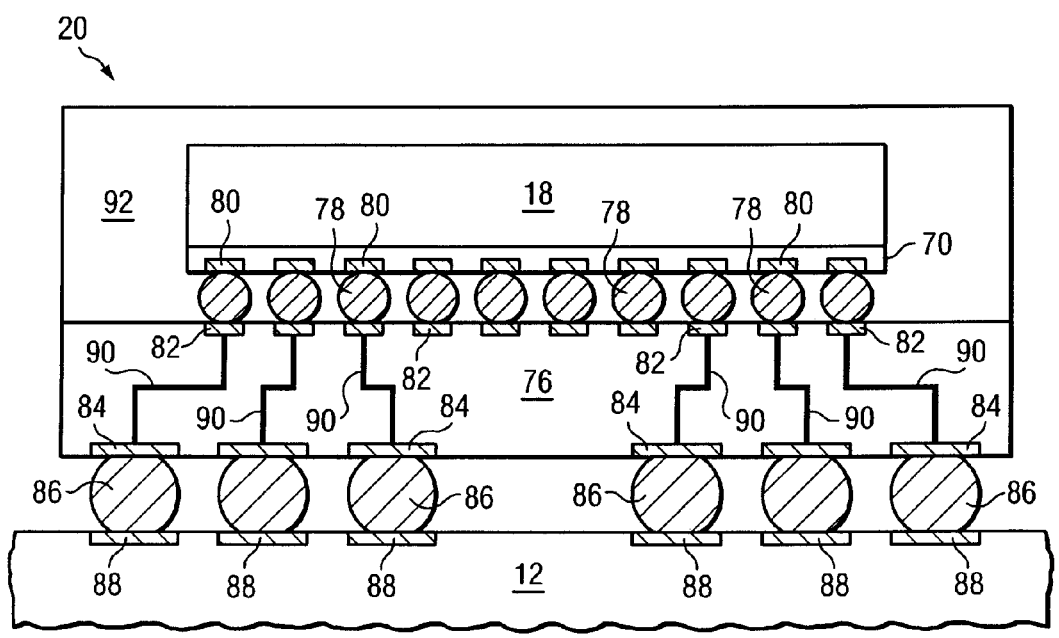

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

FIGS. 3a-3d illustrate a method of manufacturing semiconductor device 100 having an interconnect structure providing top and bottom interconnects formed by solder bumps. Turning to FIG. 3a, substrate 102 is provided. In one embodiment, substrate 102 includes a bare Cu sheet suitable for attaching a plurality of solder bumps. In alternative embodiments, substrate 102 includes other metals or substrate materials over which solder bumps may be deposited and connected. A solder material is deposited over substrate 102 using a ball drop or stencil printing process, for example. The solder material includes an electrically conductive material such as Sn, Pb, Au, Ag, Cu, Zn, Bi, and alloys thereof, with an optional flux material. For example, the solder material can be eutectic Sn/Pb, high lead, or lead free. The solder (or other conductive material) is reflowed to form bumps 104. Bumps 104 are mechanically connected to substrate 102.

Die 106 is mounted to substrate 102 using die attach adhesive 110. Die 106 includes semiconductor devices, or other electronic chips or ICs and provides various functions such as memory, controller, ASICs, processor, microcontroller, or combinations thereof. Die attach adhesive 110 includes an underfill or epoxy polymer material for bonding die 106 to substrate 102. In alternative embodiments, die attach adhesive 110 includes a laminated polymer adhesive or an ultraviolet (UV) curable liquid adhesive, for example. Contact pads 108 are made with a conductive material, such as Al, Cu, Sn, Ni, Au, or Ag, and are electrically connected to the circuit elements formed within die 106. Contact pads 108 are formed by PVD, CVD, electrolytic plating, or electroless plating processes, for example.

Turning to FIG. 3b, encapsulant 112 is deposited over substrate 102 around bumps 104 and over die 106. Encapsulant 112 includes an epoxy resin, or polyimide, for example, and may be deposited by spin-coating, dispensing, or printing. As shown in FIG. 3b, the deposition of encapsulant 112 is controlled to expose a top surface of bumps 104. Depending upon the application, 1-25% of the surface of bumps 104 is exposed above the encapsulant 112. In an alternative embodiment, the exposed portions of bumps 104 are flattened after deposition of encapsulant 112 to be level with a top surface of encapsulant 112. Vias 114 are formed in encapsulant 112 by blind etching to expose contact pads 108. Blind etching involves removing a portion of encapsulant 112 and may be performed by laser drilling or etching, wet etching, or another etching process.

Turning to FIG. 3c, redistribution layer (RDL) 116 is deposited over semiconductor device 100 to interconnect bumps 104 and contact pads 108 of die 106. RDL 116 can be made with Ni, NiV, Cu, or other conductive materials. RDL 116 routes electrical signals between die 106 and bumps 104. RDL 116 is formed by PVD, CVD, electrolytic plating, or electroless plating processes. With RDL 116 deposited, bumps 104 are electrically connected to the circuits and devices formed within die 106.

Turning to FIG. 3d, a backgrinding process is applied to substrate 102 to remove substrate 102 and to expose a back surface of bumps 104 and die attach adhesive 110. The backgrinding process may involve chemical-mechanical polishing (CMP), wet etching, plasma etching, or another etching process suitable for removing substrate 102. With substrate 102 removed, semiconductor device 100 may be mounted to motherboards, PCBs, or other substrates using bumps 104 as the interconnect structure for placing die 106 in communication with other system components. An optional passivation layer (not shown) is deposited over semiconductor device 100 to cover RDL 116 and provide electrical insulation and physical protection. The optional passivation layer may include one or more layers of silicon dioxide (SiO2), silicon nitride (Si3N4), silicon oxy-nitride (SiON), or another insulating material.

Using the above method, a semiconductor device is formed that provides a wafer-level chip-scale package (WLCSP) having both top and bottom surface interconnects. Rather than use through-silicon or through-hole vias, which require an expensive and time-consuming manufacturing process, the interconnect structure is formed by a plurality of solder bumps. The bumps are formed using a simplified manufacturing process that allows for formation of the bumps directly over a copper strip, or other metal substrate. Because the bumps are formed directly on the substrate, additional pad layers for building up the bumps or insulation layers are not necessary.

An encapsulant is deposited over the device and a top and bottom surface of the solder bumps are exposed to provide top and bottom surface interconnects for the semiconductor device. An RDL structure is formed over the device to interconnect the bumps and the die. In the present embodiment, the RDL structure is flat and formed directly over a surface of the encapsulant. Because the interconnect structure of the semiconductor device is formed by solder bumps rather than small input/output pins, the process of mounting the device to a motherboard configured for BGA-type device mounting is simplified. Accordingly, the present method mitigates several difficulties associated with forming WLCSPs using dies having relatively high input/output pin counts.

FIGS. 4a and 4b illustrate alternative configurations for the plurality of solder bumps that form the interconnect structure of the present semiconductor device. Turning to FIG. 4a, a plurality of solder bumps 206 are disposed within encapsulant 202 deposited around die 200. The deposition of encapsulant 202 is controlled to expose a top surface of bumps 206 and contact pads 204 that are formed over a surface of die 200. RDL 208 is formed over a surface of encapsulant 202 and die 200 to form an electrical interconnection between die 200 and bumps 206. As shown in FIG. 4a, bumps 206 provide a single row of interconnect structures to facilitate mounting the device to other system components. In alternative embodiments, bumps 206 are configured in multiple rows. As shown in FIG. 4b, bumps 206 are configured in two rows of staggered bumps 206. RDL 208 is deposited over die 200 and encapsulant 202 to connect bumps 206 from both rows to contact pads 204 of die 200.

Figure 5A:
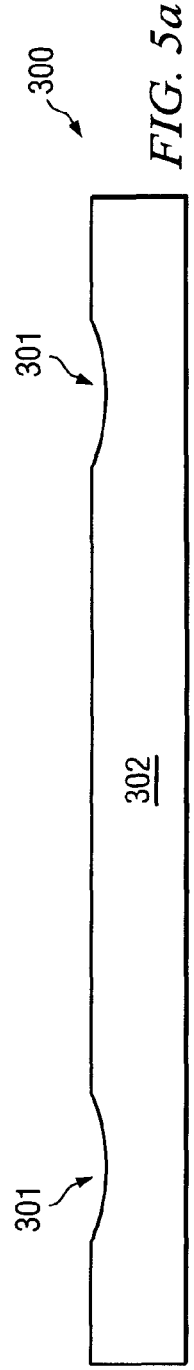
FIGS. 5a-5d illustrate a method of manufacturing a semiconductor device having an interconnect structure providing top and bottom interconnects formed by solder bumps, the semiconductor device is manufactured using a substrate having solder capture dents.

FIGS. 5a-5d illustrate a method of manufacturing semiconductor device 300 having an interconnect structure providing top and bottom interconnects formed by solder bumps, semiconductor device 300 is manufactured using a substrate having solder capture dents 301. Turning to FIG. 5a, substrate 302 is provided. In one embodiment, substrate 302 includes a bare Cu sheet suitable for attaching a plurality of solder bumps. Solder capture dents 301 are formed within a surface of substrate 302 to facilitate the deposition of conductive material over substrate 302. In one embodiment, solder capture dents 301 are configured to receive 1-25% of the total volume of bumps 304. Generally, the geometric shape of solder capture dents 301 is semi-spherical; however, other configurations may be used depending upon the application.

Figure 5B:
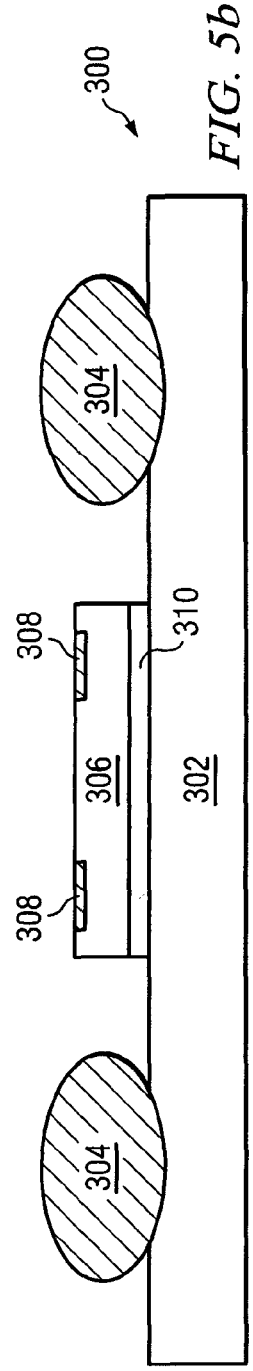

Turning to FIG. 5b, a solder material is deposited over solder capture dents 301 of substrate 302 using a ball drop or stencil printing process, for example. The solder material includes an electrically conductive material such as Sn, Pb, Au, Ag, Cu, Zn, Bi, and alloys thereof, with an optional flux material. The solder (or other conductive material) is reflowed to form bumps 304. Bumps 304 are mechanically connected to substrate 302.

Die 306 is mounted to substrate 302 using die attach adhesive 310. Die 306 includes semiconductor devices, or other electronic chips or ICs and provides various functions such as memory, controller, ASICs, processor, microcontroller, or combinations thereof. Die attach adhesive 310 includes an underfill or epoxy polymer material for bonding die 306 to substrate 302. In alternative embodiments, die attach adhesive 310 includes a laminated polymer adhesive or a UV curable liquid adhesive, for example. Contact pads 308 are made with a conductive material, such as Al, Cu, Sn, Ni, Au, or Ag, and are electrically connected to the circuit elements formed within die 306. Contact pads 308 are formed by PVD, CVD, electrolytic plating, or electroless plating processes, for example.

Figure 5C:
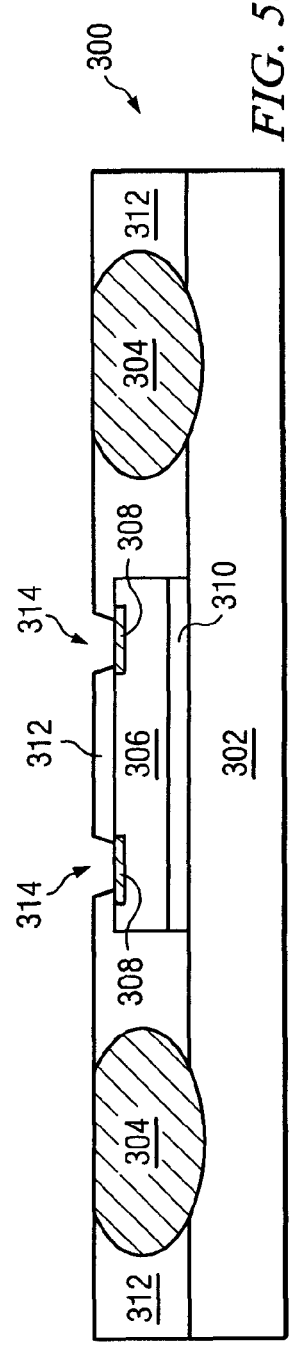

Turning to FIG. 5c, encapsulant 312 is deposited over substrate 302 around bumps 304 and over die 306. Encapsulant 312 includes an epoxy resin, or polyimide, for example, and may be deposited by spin-coating, dispensing, printing, or transfer molding. As shown in FIG. 5c, the deposition of encapsulant 312 is controlled to expose a top surface of bumps 304, or encapsulant 312 may be planarized to expose bumps 304. Vias 314 are formed in encapsulant 312 by blind etching to expose contact pads 308. Blind etching involves removing a portion of encapsulant 312 and may be performed by laser drilling or etching, wet etching, or another etching process.

Figure 5D:
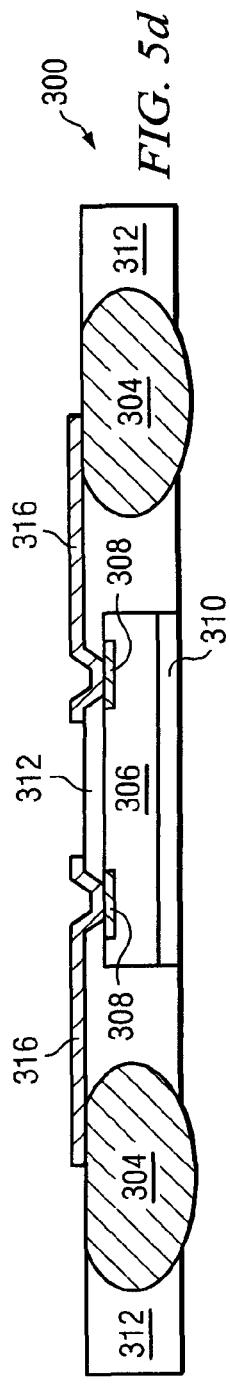

Turning to FIG. 5d, RDL 316 is deposited over semiconductor device 300 to interconnect bumps 304 and contact pads 308 of die 306. RDL 316 can be made with Ni, NiV, Cu, or other conductive materials. RDL 316 routes electrical signals between die 306 and bumps 304. RDL 316 is formed by PVD, CVD, electrolytic plating, or electroless plating processes. With RDL 316 deposited, bumps 304 are electrically connected to the circuits and devices formed within die 306.

A backgrinding process is applied to substrate 302 to remove substrate 302 and to expose a back surface of bumps 304 and die attach adhesive 310. The backgrinding process may involve CMP, wet etching, plasma etching, or another etching process suitable for removing substrate 302. With substrate 302 removed, semiconductor device 300 may be mounted to motherboards, PCBs, or other substrates using bumps 304 as the interconnect structure for placing die 306 in communication with other system components. An optional passivation layer (not shown) is deposited over semiconductor device 300 to cover RDL 316 and provide electrical insulation and physical protection. The optional passivation layer may include one or more layers of SiO2, Si3N4, SiON, or another insulating material.

FIG. 6 illustrates a semiconductor device having an interconnect structure providing top and bottom interconnects formed by solder bumps, a top surface of the solder bumps protrudes past a top-surface of the encapsulant. Solder bumps 402 are formed using a ball drop or stencil printing process. Solder material is reflowed to form solder bumps 402. Die 404 is mounted next to bumps 402 using die attach adhesive 408. Die 404 includes semiconductor devices, or other electronic chips or ICs and provides various functions such as memory, controller, ASICs, processor, microcontroller, or combinations thereof. Die attach adhesive 408 includes an underfill or epoxy polymer material. Contact pads 406 are made with a conductive material, such as Al, Cu, Sn, Ni, Au, or Ag, and are electrically connected to the circuit elements formed within die 404. Contact pads 406 are formed by PVD, CVD, electrolytic plating, or electroless plating processes, for example.

Encapsulant 410 is deposited around bumps 402 and over die 404. Encapsulant 410 includes an epoxy resin, or polyimide, for example, and may be deposited by spin-coating, dispensing, or printing. As shown in FIG. 6, the deposition of encapsulant 410 is controlled to expose a top surface of bumps 402. Vias are formed in encapsulant 410 by blind etching to expose contact pads 408.

RDL 412 is deposited over encapsulant 410 to interconnect bumps 402 and contact pads 406 of die 404. RDL 412 can be made with Ni, NiV, Cu, or other conductive materials. RDL 412 routes electrical signals between die 404 and bumps 402. RDL 412 is formed by PVD, CVD, electrolytic plating, or electroless plating processes. With RDL 412 deposited, bumps 402 are electrically connected to the circuits and devices formed within die 404.

An optional passivation layer (not shown) is deposited over the semiconductor device to cover RDL 412 and provide electrical insulation and physical protection. The optional passivation layer may include one or more layers of SiO2, Si3N4, SiON, or another insulating material.

FIG. 7 illustrates a semiconductor device having an interconnect structure providing top and bottom interconnects formed by solder bumps, a top surface of the semiconductor device is planarized to expose the solder bumps. Solder bumps 414 are formed using a ball drop or stencil printing process. Solder material is reflowed to form solder bumps 414. Die 416 is mounted next to bumps 414 using die attach adhesive 420. Die 416 includes semiconductor devices, or other electronic chips or ICs and provides various functions such as memory, controller, ASICs, processor, microcontroller, or combinations thereof. Die attach adhesive 420 includes an underfill or epoxy polymer material. Contact pads 418 are made with a conductive material, such as Al, Cu, Sn, Ni, Au, or Ag, and are electrically connected to the circuit elements formed within die 416. Contact pads 418 are formed by PVD, CVD, electrolytic plating, or electroless plating processes, for example.

Encapsulant 422 is deposited over bumps 414 and over die 416. Encapsulant 422 includes an epoxy resin, or polyimide, for example, and may be deposited by spin-coating, dispensing, or printing. After encapsulant 422 is deposited, it is planarized to remove a portion of encapsulant 422 and to expose a top surface of bumps 414. During planarization, a portion of both encapsulant 422 and bumps 424 may be removed. Encapsulant 422 is planarized using a CMP, mechanical backgrinding, plasma etching, wet etch, dry etch or other thinning or planarization process. Vias are formed in encapsulant 422 by blind etching to expose contact pads 418.

RDL 424 is deposited over encapsulant 422 to interconnect bumps 414 and contact pads 418 of die 416. RDL 424 can be made with Ni, NiV, Cu, or other conductive materials. RDL 424 routes electrical signals between die 416 and bumps 414. RDL 424 is formed by PVD, CVD, electrolytic plating, or electroless plating processes. With RDL 424 deposited, bumps 414 are electrically connected to the circuits and devices formed within die 416.

An optional passivation layer (not shown) is deposited over the semiconductor device to cover RDL 424 and provide electrical insulation and physical protection. The optional passivation layer may include one or more layers of SiO2, Si3N4, SiON, or another insulating material.

FIG. 8 illustrates a semiconductor device having an interconnect structure providing top and bottom interconnects formed by solder bumps, vias are formed in the encapsulant to expose contact pads of the die and a top surface of the solder bumps. Solder bumps 426 are formed using a ball drop or stencil printing process. Solder material is reflowed to form solder bumps 426. Die 428 is mounted next to bumps 426 using die attach adhesive 432. Die 428 includes semiconductor devices, or other electronic chips or ICs and provides various functions such as memory, controller, ASICs, processor, microcontroller, or combinations thereof. Die attach adhesive 432 includes an underfill or epoxy polymer material. Contact pads 430 are made with a conductive material, such as Al, Cu, Sn, Ni, Au, or Ag, and are electrically connected to the circuit elements formed within die 428. Contact pads 430 are formed by PVD, CVD, electrolytic plating, or electroless plating processes, for example.

Encapsulant 434 is deposited over bumps 426 and over die 428. Encapsulant 434 includes an epoxy resin, or polyimide, for example, and may be deposited by spin-coating, dispensing, or printing. Vias are formed in encapsulant 434 by blind etching to expose both contact pads 430 and a top surface of bumps 426.

RDL 436 is deposited over encapsulant 434 to interconnect bumps 426 and contact pads 430 of die 428. RDL 436 can be made with Ni, NiV, Cu, or other conductive materials. RDL 436 routes electrical signals between die 428 and bumps 426. RDL 436 is formed by PVD, CVD, electrolytic plating, or electroless plating processes. RDL 436 is deposited conformally over a surface of encapsulant 434 into the vias formed over contact pads 430 of die 428 and bumps 426. With RDL 436 deposited, bumps 426 are electrically connected to the circuits and devices formed within die 428.

An optional passivation layer (not shown) is deposited over the semiconductor device to cover RDL 436 and provide electrical insulation and physical protection. The optional passivation layer may include one or more layers of SiO2, Si3N4, SiON, or another insulating material.

FIG. 9 illustrates semiconductor device 500 having an interconnect structure providing top and bottom interconnects formed by solder bumps, RDLs are formed over a top surface and a bottom surface of semiconductor device 500. Solder bumps 502 are formed using a ball drop or stencil printing process. Solder material is reflowed to form solder bumps 502. Die 504 is mounted next to bumps 502 using die attach adhesive 508. Die 504 includes semiconductor devices, or other electronic chips or ICs and provides various functions such as memory, controller, ASICs, processor, microcontroller, or combinations thereof. Die attach adhesive 508 includes an underfill or epoxy polymer material. Contact pads 506 are made with a conductive material, such as Al, Cu, Sn, Ni, Au, or Ag, and are electrically connected to the circuit elements formed within die 504. Contact pads 506 are formed by PVD, CVD, electrolytic plating, or electroless plating processes, for example.

Encapsulant 510 is deposited around bumps 502 and over die 504. Encapsulant 510 includes an epoxy resin, or polyimide, for example, and may be deposited by spin-coating, dispensing, or printing. As shown in FIG. 9, the deposition of encapsulant 510 is controlled to expose a top surface of bumps 502. Vias are formed in encapsulant 510 by blind etching to expose contact pads 506.

RDL 512 is deposited over encapsulant 510 to interconnect bumps 502 and contact pads 506 of die 504. RDL 512 can be made with Ni, NiV, Cu, or other conductive materials. RDL 512 routes electrical signals between die 504 and bumps 502. RDL 512 is formed by PVD, CVD, electrolytic plating, or electroless plating processes. With RDL 512 deposited, bumps 502 are electrically connected to the circuits and devices formed within die 504. As shown in FIG. 9, RDL 514 is formed over a back surface of semiconductor device 500. RDL 514 may form electrical connections between one or more bumps 502 and contact pads 506 of die 504, or may provide an alternative electrical interconnection network for connecting semiconductor device 500 to other system components. In alternative embodiments, additional layers of under-bump metallization or polyimide layers are formed over the device to provide additional routing capability and top and bottom interconnect pad formations. Depending upon the application, RDLs 512 and 514 may be used for re-routing electrical signals and the creation of pads and/or interconnect bumps for mounting semiconductor device 500 to a PCB or for device stacking.

An optional passivation layer (not shown) is deposited over the semiconductor device to cover RDLs 512 and 514 and provide electrical insulation and physical protection. The optional passivation layer may include one or more layers of SiO2, Si3N4, SiON, or another insulating material.

Figure 10C:
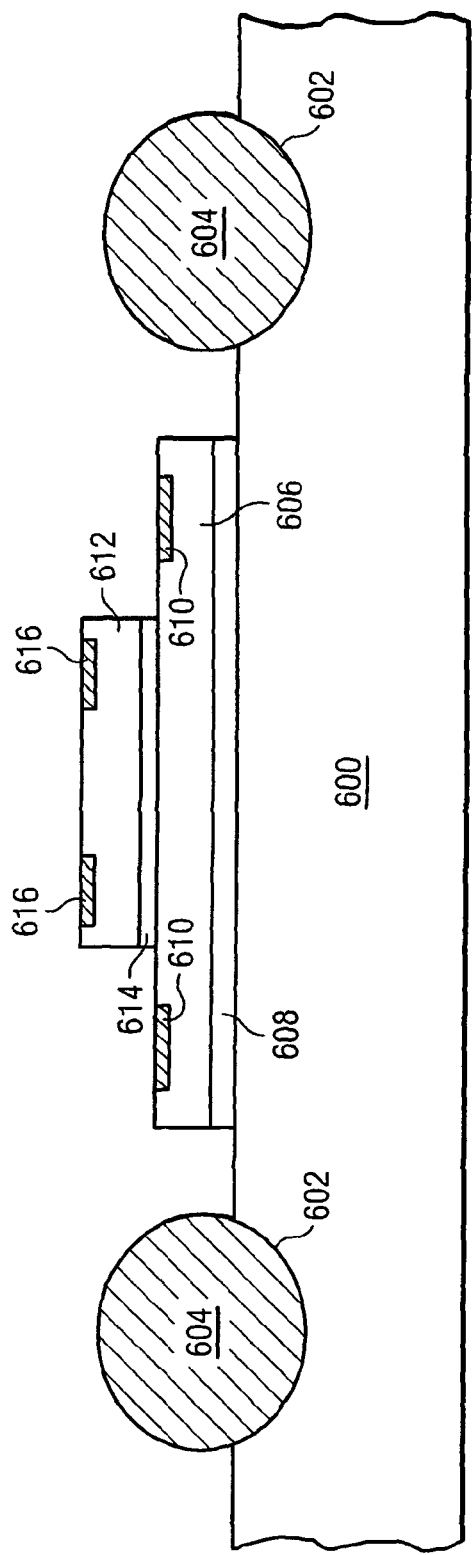

FIGS. 10a-10h show another embodiment of the semiconductor device having top and bottom solder bump interconnect structure. In FIG. 10a, a temporary substrate or carrier 600 contains dummy or sacrificial base material such as silicon, polymer, polymer composite, metal, ceramic, glass, glass epoxy, beryllium oxide, or other suitable low-cost, rigid material or bulk semiconductor material for structural support. In one embodiment, carrier 600 is a bare Cu sheet suitable for attaching a plurality of solder bumps. Solder capture indentations 602 are formed within a surface of carrier 600 to facilitate the deposition of conductive solder material. The indentations 602 can be formed to a semi-spherical shape by punching or etching. Other indentation shapes may be formed depending upon the application. FIG. 10b shows a top view of carrier 600 with indentations 602.

In FIG. 10c, an electrically conductive solder material is deposited over indentations 602 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 604.

A semiconductor die 606 is mounted to carrier 600 using die attach adhesive 608. A semiconductor die 612 is mounted to semiconductor die 606 using die attach adhesive 614. Semiconductor die 606 and 612 each include analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement baseband digital circuits, such as digital signal processor (DSP), memory, or other signal processing circuit. Semiconductor die 606 and 612 may also contain integrated passive devices (IPD), such as inductors, capacitors, and resistors, for radio frequency (RF) signal processing. Contact pads 610 electrically connect to active and passive devices and signal traces within the active surface of semiconductor die 606. Contact pads 616 electrically connect to active and passive devices and signal traces within the active surface of semiconductor die 612. Contact pads 610 and 616 are formed by PVD, CVD, electrolytic plating, or electroless plating processes. Contact pads 610 and 616 can be one or more layers of Al, Cu, Sn, Ni, Au, Ag, or other suitable electrically conductive material. Die attach adhesive 608 and 614 includes an underfill or epoxy polymer material. In other embodiments, die attach adhesive 608 and 614 include a laminated polymer adhesive or a UV curable liquid adhesive.

Figure 10D:
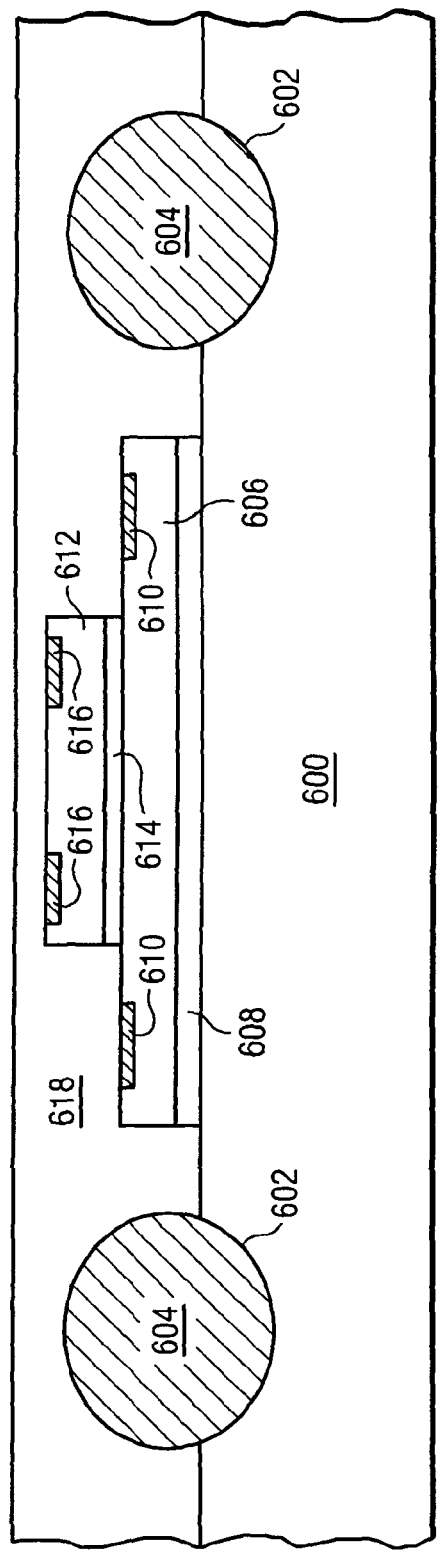

In FIG. 10d, an encapsulant or molding compound 618 is deposited over the stacked semiconductor die 606 and 612 and around solder bumps 604 using a printing, compressive molding, transfer molding, liquid encapsulant molding, or other suitable applicator. The encapsulant 618 can be epoxy resin, epoxy acrylate, polymer, or polymer composite material. The encapsulant 618 is non-conductive and environmentally protects the semiconductor device from external elements and contaminants.

Figure 10E:
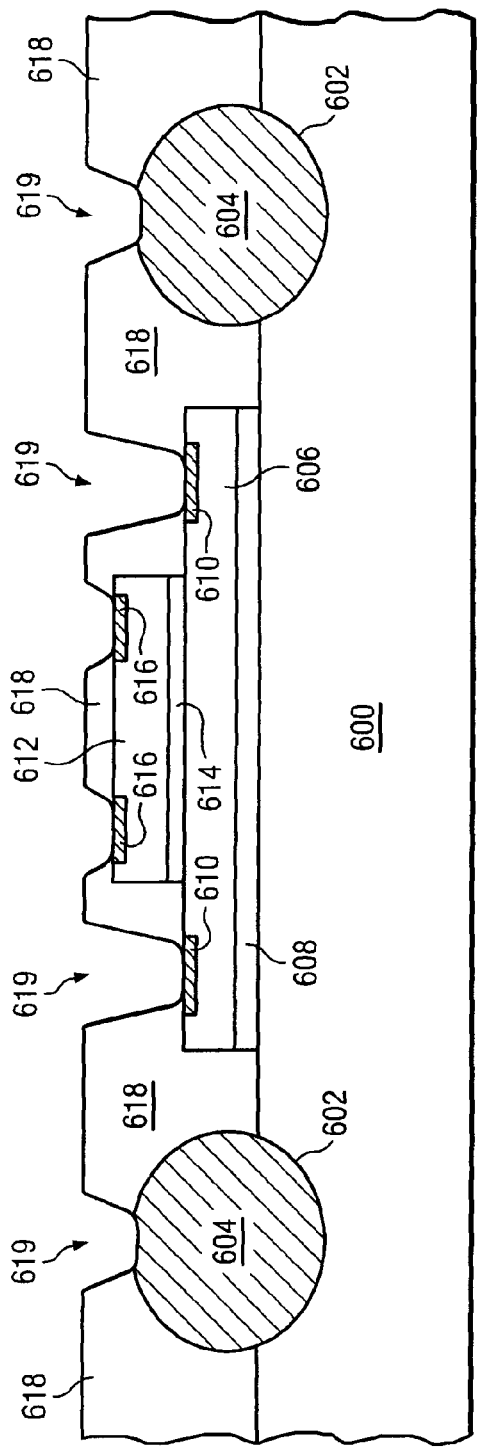

In FIG. 10e, a portion of encapsulant 618 is removed by laser drilling or etching process such as deep reactive ion etching (DRIE) to form vias 619 which expose a top surface of solder bumps 604, as well as contact pads 610 and 616. The vias 619 are formed to different depths depending on the underlying structure. For example, the vias 619 over contact pad 610 are deeper than the vias 619 over contact pad 616.

Figure 10F:
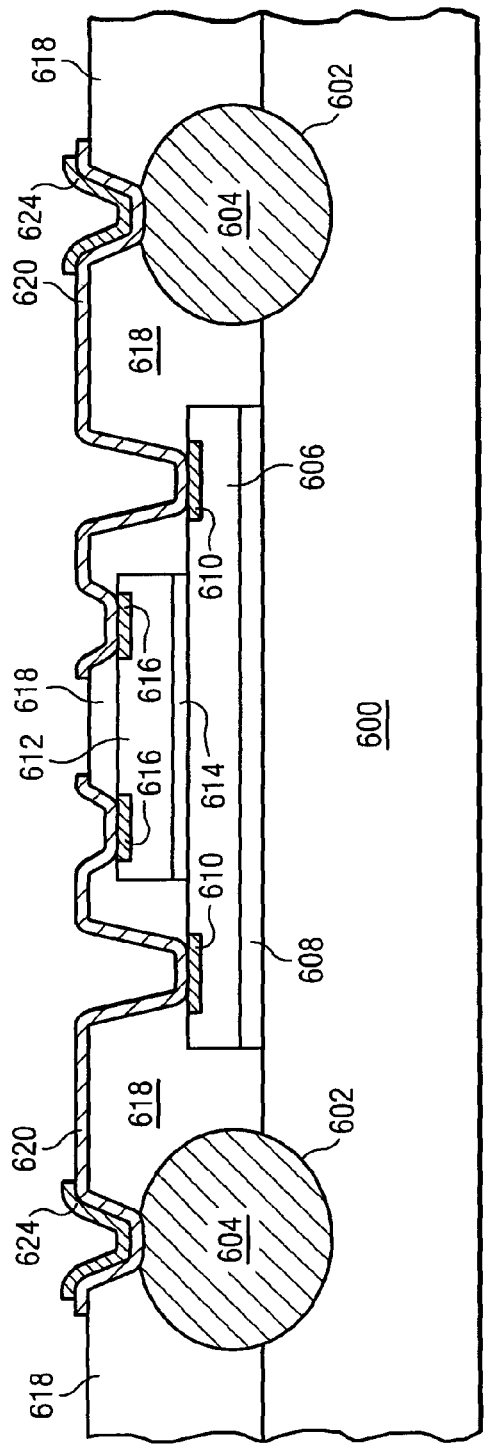

In FIG. 10f, a conductive layer 620 is conformally applied over encapsulant 618 into vias 619 and operates as a redistribution layer (RDL) to electrically connect solder bumps 604 to contact pads 610 and 616. RDL 620 routes electrical signals between solder bumps 604 and the circuits within the active surfaces of semiconductor die 606 and 612. Conductive layer 620 is formed by evaporation, sputtering, PVD, CVD, electrolytic plating, electroless plating process, or other suitable metal deposition process. Conductive layer 620 can be one or more layers of Al, Cu, Sn, Ni, nickel vanadium (NiV), Au, Ag, or other suitable electrically conductive material.

An optional under bump metallization layer (UBM) 624 is formed over conductive layer 620 above solder bumps 604. UBM 624 can be a multi-metal stack with adhesion layer, barrier layer, and seed or wetting layer. The adhesion layer is formed over conductive layer 620 and can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 620 and solder bumps 604 or other interconnect structure. UBM 624 provides a low resistive interconnect to conductive layer 620, as well as a barrier to solder diffusion and seed layer for solder wettability.

Figure 10G:
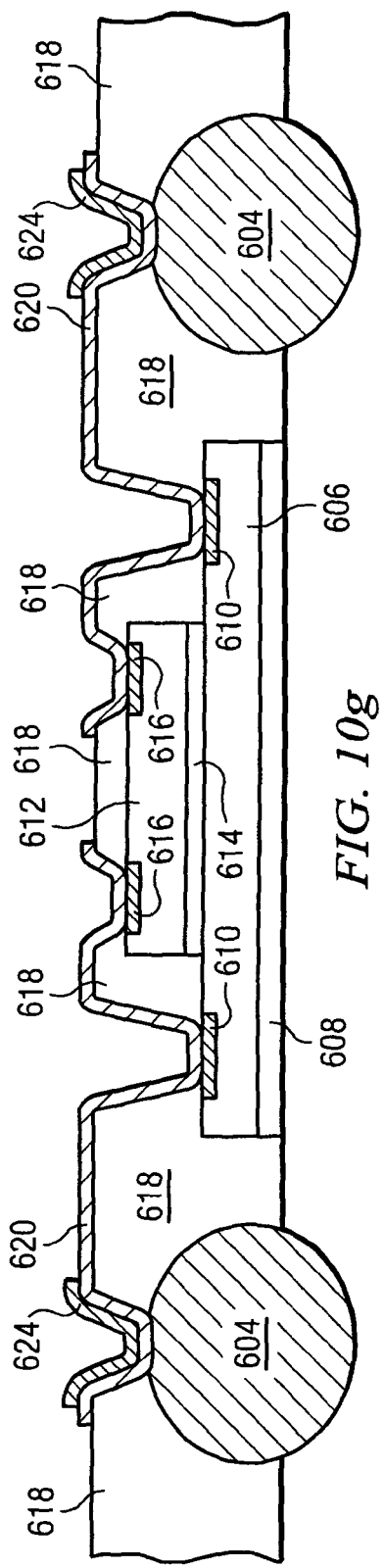

In FIG. 10g, carrier 600 is removed by chemical etching, mechanical peel-off, CMP, wet etching, plasma etching, or mechanical grinding.

Figure 10H:
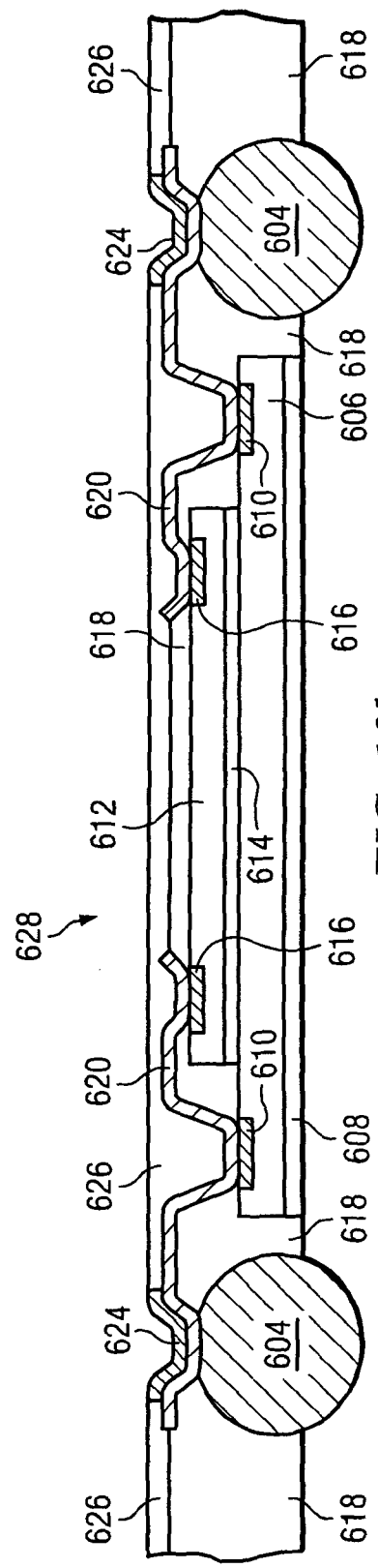

In FIG. 10h, a passivation or insulating layer 626 is formed over encapsulant 618 and conductive layer 620. The passivation layer 626 can be one or more layers of silicon dioxide (SiO2), silicon nitride (Si3N4), silicon oxynitride (SiON), tantalum pentoxide (Ta2O5), zircon (ZrO2), aluminum oxide (Al2O3), or other suitable insulating material. The insulating layer 626 is patterned or blanket deposited using PVD, CVD, printing, sintering, or thermal oxidation.

Figure 11A:
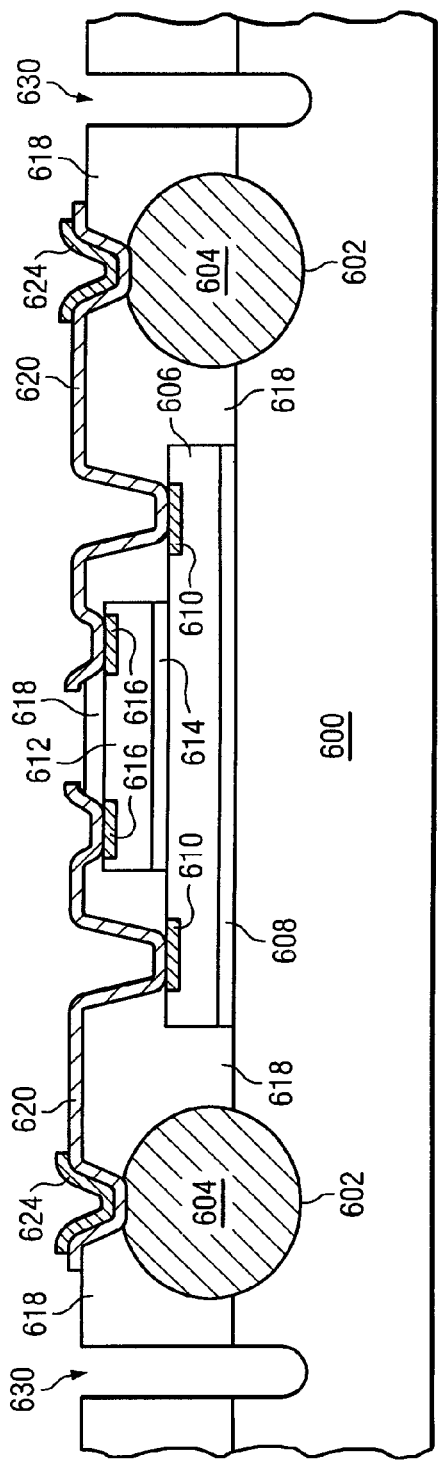
FIGS. 11a-11e illustrate a modification to the process from FIG. 10f.
Figure 11B:
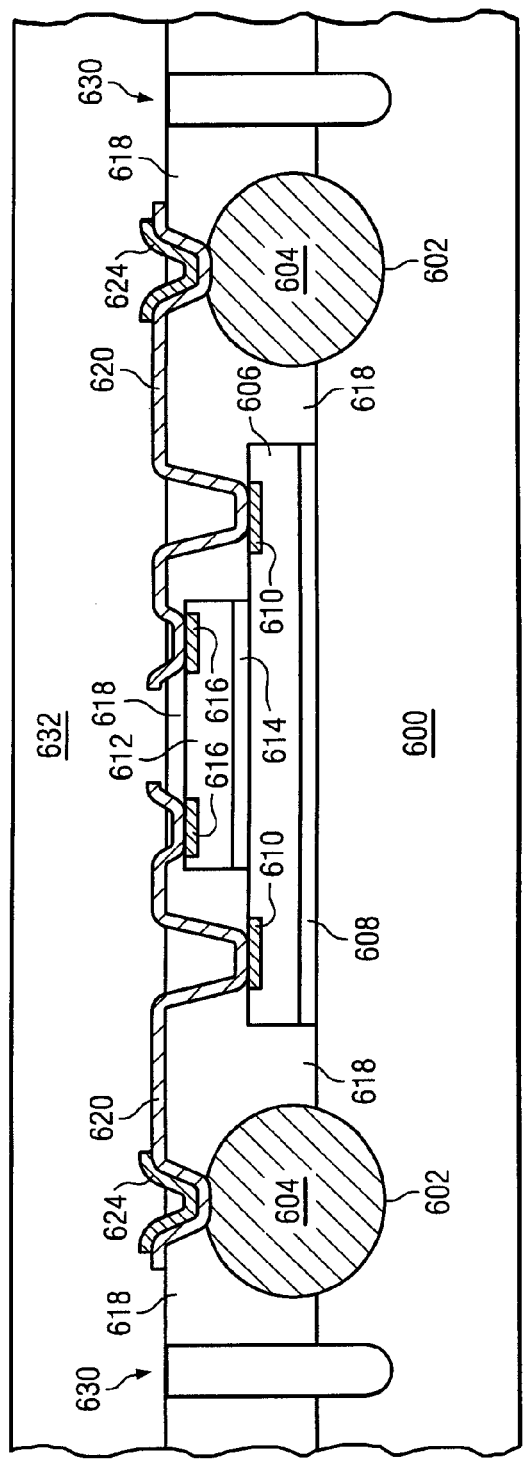
Figure 11C:
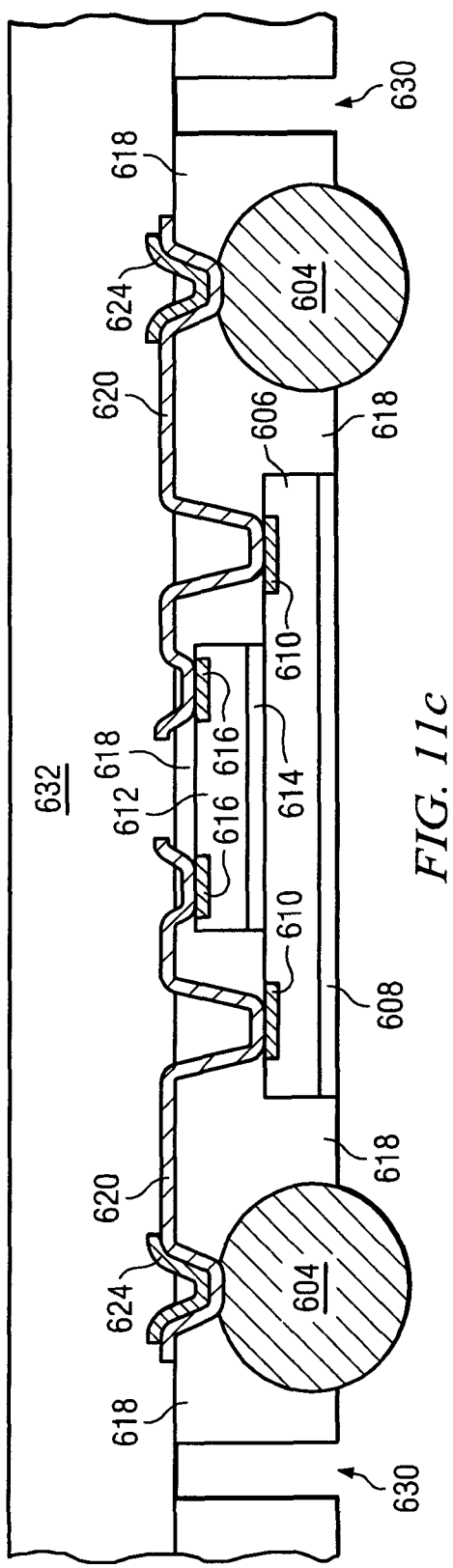
Figure 11D:
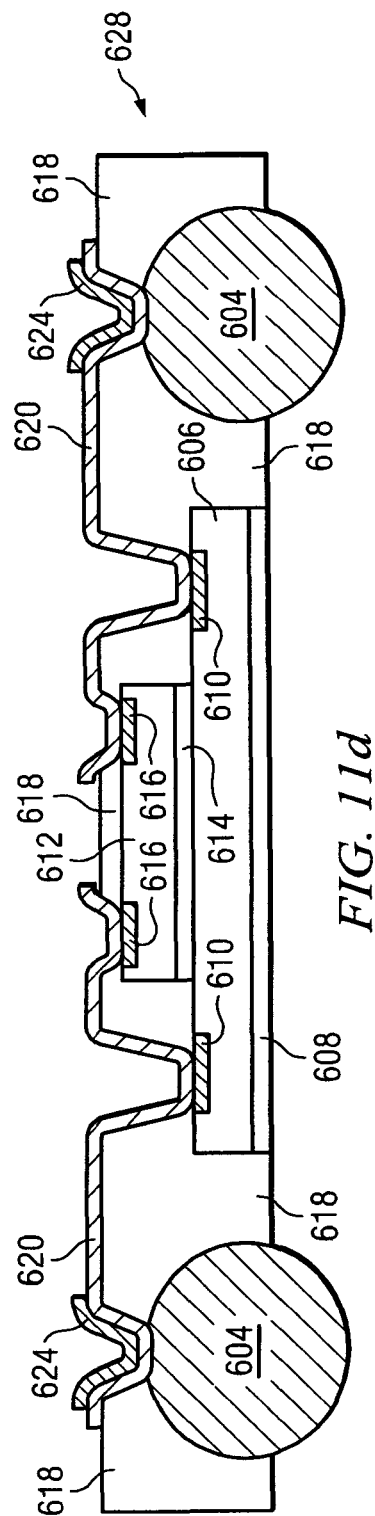
Figure 11E:
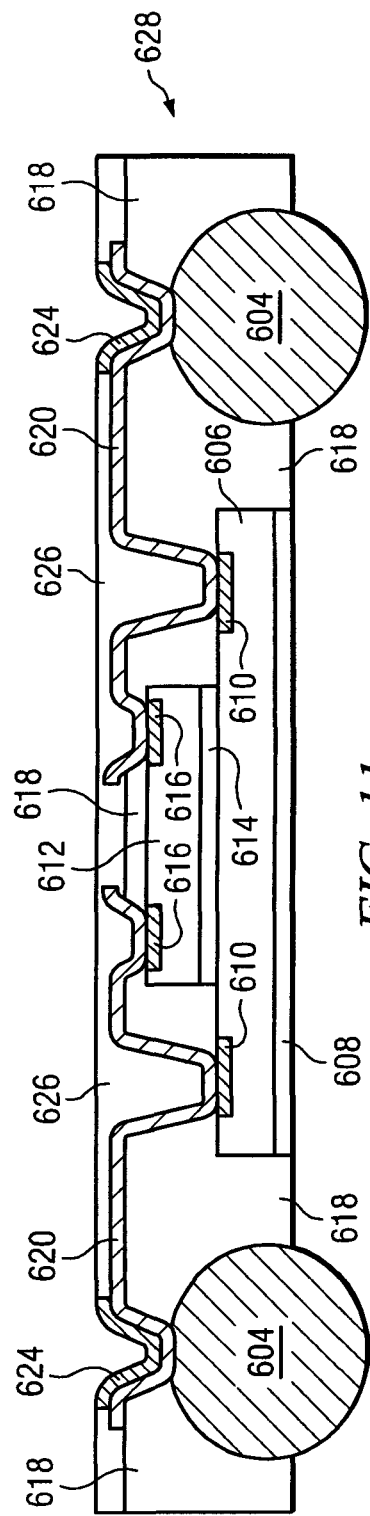

As a modification to the above process, following FIG. 10f, a portion of encapsulant 618 is removed to form vias 630, as shown in FIG. 11a. The vias 630 are formed by laser cutting or saw blade and extend down into carrier 600. A carrier tape 632 is applied over encapsulant 618, conductive layer 620, and vias 630 in FIG. 11b. In FIG. 11c, carrier 600 is removed by chemical etching, mechanical peel-off, CMP, wet etching, plasma etching, or mechanical grinding. The carrier tape 632 is removed in FIG. 11d. The passivation layer 626 is formed over encapsulant 618 and conductive layer 620 in FIG. 11e.

Figure 12:
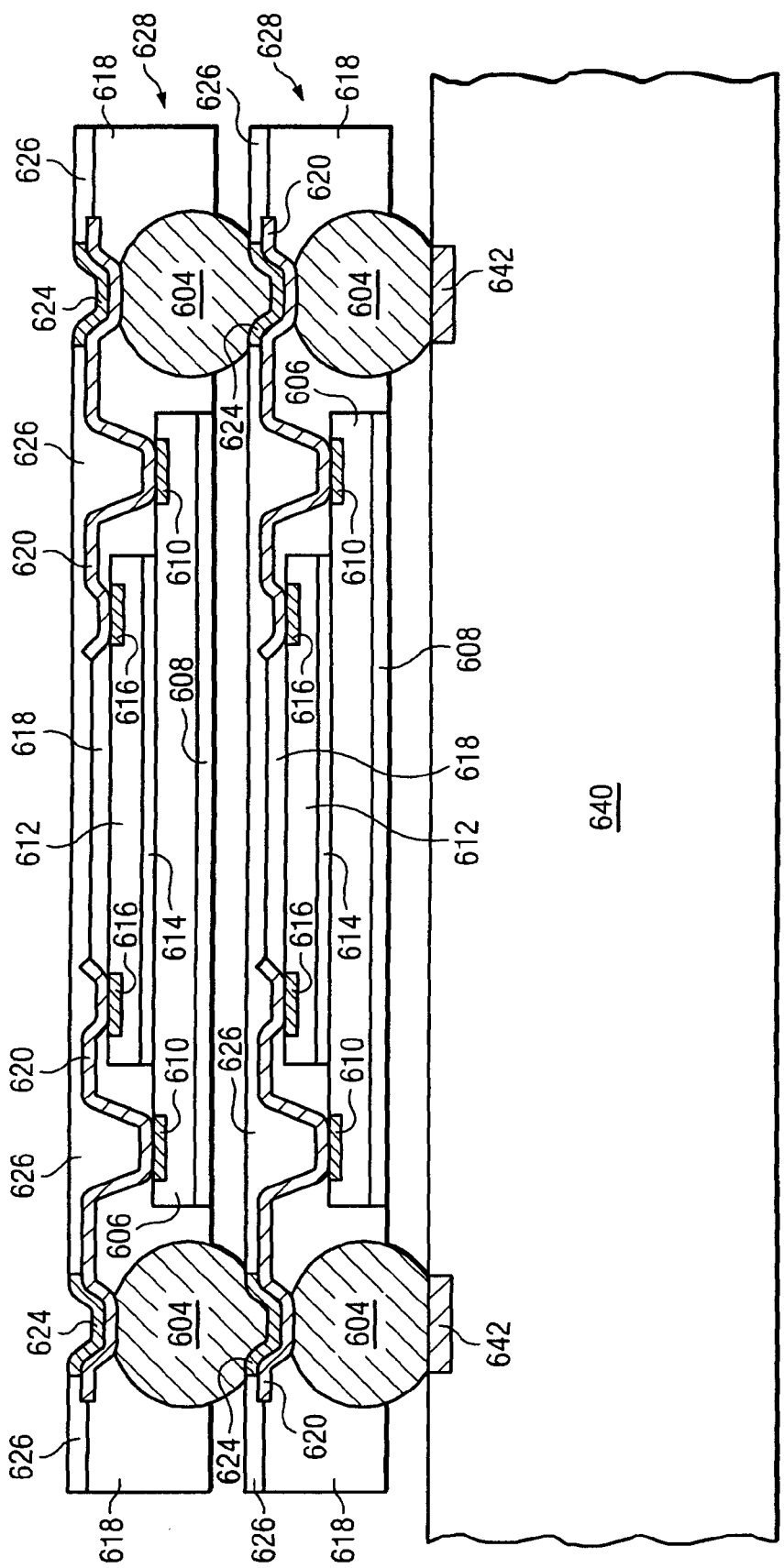
FIG. 12 illustrates stacked semiconductor device having the interconnect structure of FIG. 10h mounted to a PCB.

The resulting semiconductor package 628, similar to FIG. 10h, is stackable. FIG. 12 shows two semiconductor packages 628 stacked on substrate or PCB 640. Conductive layer 624 is electrically connected to contact pads 610 and 616 on semiconductor die 606 and 612 through solder bumps 604 and RDL 620.

Figure 13:
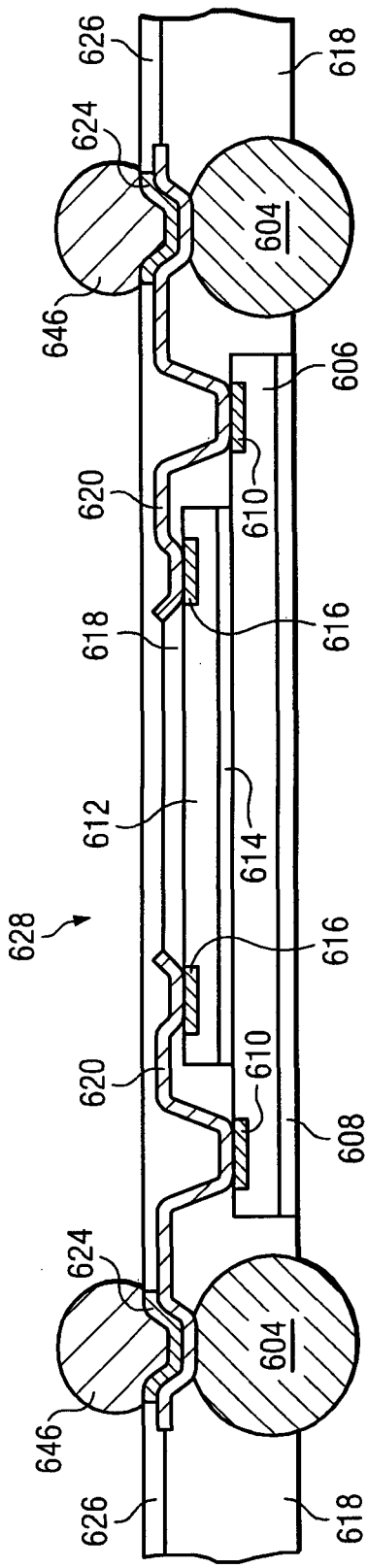
FIG. 13 illustrates solder bumps formed over the interconnect structure of FIG. 10h.

FIG. 13 shows an embodiment of semiconductor package 628 with solder bumps 646 formed on UBM 624. An electrically conductive solder material is deposited over UBM 624 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 646. In some applications, solder bumps 646 are reflowed a second time to improve electrical contact to UBM 624.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
providing a copper carrier;
forming a plurality of first bumps over the copper carrier;
disposing a first semiconductor die including a plurality of contact pads over the copper carrier with the contact pads oriented away from the copper carrier;
depositing an encapsulant over the copper carrier, first bumps, and first semiconductor die;
removing a portion of the encapsulant to expose the first bumps and the contact pads of the first semiconductor die;
forming a conductive layer over a surface of the encapsulant to contact an exposed portion of the first bumps and the contact pads of the first semiconductor die; and
removing the copper carrier after removing the portion of the encapsulant.

2. The method of claim 1, further including forming indentations in the copper carrier for receiving the first bumps.

3. The method of claim 1, further including forming an insulating layer over the conductive layer and encapsulant.

4. The method of claim 1, further including disposing a second semiconductor die over the first semiconductor die.

5. The method of claim 1, further including:
stacking a plurality of the semiconductor devices; and
electrically connecting the semiconductor devices through the first bumps.

6. The method of claim 1, further including forming a second bump over the first bump.

7. A method of making a semiconductor device, comprising:
providing a substrate;
forming a plurality of first bumps over the substrate;
disposing a first semiconductor die including contact pads over the substrate with the contact pads oriented away from the substrate;
depositing an encapsulant over the substrate, first bumps, and first semiconductor die;
removing a first portion of the encapsulant to expose the first bumps and contact pads of the first semiconductor die; and
forming a conductive layer over a surface of the encapsulant and extending from an exposed portion of the first bumps to the contact pads of the first semiconductor die.

8. The method of claim 7, further including removing the substrate.

9. The method of claim 6, wherein the substrate includes copper.

10. The method of claim 6, further including:
forming indentations in the substrate; and
forming the first bumps over the indentations.

11. The method of claim 6, further including forming an insulating layer over the conductive layer and encapsulant.

12. The method of claim 6, further including disposing a second semiconductor die over the first semiconductor die.

13. The method of claim 6, further including:
stacking a plurality of the semiconductor devices; and
electrically connecting the semiconductor devices through the first bumps.

14. The method of claim 6, further including forming a second bump over the first bump.

15. A method of making a semiconductor device, comprising:
providing a substrate;
forming an interconnect structure over the substrate;
disposing a semiconductor die including contact pads over the substrate with the contact pads oriented away from the substrate;
depositing an encapsulant over the substrate;
removing a first portion of the encapsulant to expose the interconnect structure and semiconductor die; and
forming a conductive layer over a surface of the encapsulant and extending from an exposed portion of the interconnect structure to the semiconductor die.

16. The method of claim 15, wherein the interconnect structure includes a bump.

17. The method of claim 15, further including removing the substrate.

18. The method of claim 15, wherein the substrate includes copper.

19. The method of claim 15, further including forming an insulating layer over the conductive layer and encapsulant.

20. The method of claim 15, further including:
stacking a plurality of the semiconductor devices; and
electrically connecting the semiconductor devices through the interconnect structure.

21. The method of claim 15, further including forming a bump over the interconnect structure.

22. The method of claim 15, further including:
forming an indentation in the substrate; and
forming the interconnect structure partially within the indentation.

* * * * *